United States Patent
Sim et al.

(10) Patent No.: US 10,666,236 B2
(45) Date of Patent: May 26, 2020

(54) QUADRATURE RELAXATION OSCILLATOR USING FREQUENCY ERROR COMPENSATION LOOP

(71) Applicant: POSTECH ACADEMY-INDUSTRY FOUNDATION, Pohang-si (KR)

(72) Inventors: Jae Yoon Sim, Pohang-si (KR); Ja Hyun Koo, Suwon-si (KR)

(73) Assignee: POSTECH ACADEMY-INDUSTRY FOUNDATION, Pohang-si (KR)

( * ) Notice: Subject to any disclaimer, the term of this patent is extended or adjusted under 35 U.S.C. 154(b) by 0 days.

(21) Appl. No.: 16/469,621

(22) PCT Filed: Nov. 30, 2017

(86) PCT No.: PCT/KR2017/013867
§ 371 (c)(1),
(2) Date: Jun. 13, 2019

(87) PCT Pub. No.: WO2018/110871
PCT Pub. Date: Jun. 21, 2018

(65) Prior Publication Data
US 2019/0319611 A1    Oct. 17, 2019

(30) Foreign Application Priority Data

Dec. 14, 2016 (KR) .................. 10-2016-0170156

(51) Int. Cl.
*H03K 3/0231* (2006.01)
*H03K 3/011* (2006.01)
(Continued)

(52) U.S. Cl.
CPC ......... *H03K 3/02315* (2013.01); *H03K 3/011* (2013.01); *H03K 3/0231* (2013.01); *H03K 4/501* (2013.01); *H03K 4/52* (2013.01)

(58) Field of Classification Search
CPC .. H03K 3/011; H03K 3/0231; H03K 3/02315; H03K 4/50; H03K 4/501; H03K 4/52
(Continued)

(56) References Cited

U.S. PATENT DOCUMENTS 4,017,747 A * 4/1977 Sheng .................. H03K 3/0231
327/76
4,590,444 A * 5/1986 Wilcox ................ H03K 3/0231
331/111
(Continued)

FOREIGN PATENT DOCUMENTS

KR    2008-0106687 A    12/2008
KR    2009-0043220 A    5/2009
(Continued)

OTHER PUBLICATIONS

Iternational Search Report for PCT/KR2017/013867, dated Apr. 27, 2018, 2 pp.
Written Opinion of PCT/KR2017/013867, dated Apr. 27, 2018, 6 pp.

*Primary Examiner* — Levi Gannon
(74) *Attorney, Agent, or Firm* — Morgan, Lewis & Bockius LLP

(57) ABSTRACT

The present invention relates to a technology capable of compensating for a frequency error in a quadrature relaxation oscillator. The quadrature relaxation oscillator generates a signal at a desired frequency by using a resistor and a capacitor which are less sensitive to a PVT (Process, Voltage, Temperature) variation, generates a signal at a desired frequency by compensating for an error from design, which is caused by a mismatch between circuits due to a characteristic of a semiconductor process, through a feedback lop, and removes noise.

8 Claims, 7 Drawing Sheets

(51) Int. Cl.
*H03K 4/50* (2006.01)
*H03K 4/501* (2006.01)
*H03K 4/52* (2006.01)

(58) Field of Classification Search
USPC .................................................. 331/111, 143
See application file for complete search history.

(56) References Cited

U.S. PATENT DOCUMENTS

| 7,307,485 B1 * | 12/2007 | Snyder | G01R 27/2605 |
| | | | 324/548 |
| 2007/0279137 A1 * | 12/2007 | Molina | H03K 3/011 |
| | | | 331/111 |
| 2014/0375392 A1 * | 12/2014 | Sinitsky | H03K 3/0231 |
| | | | 331/111 |
| 2020/0044629 A1 * | 2/2020 | Mikulic | H03K 5/133 |

FOREIGN PATENT DOCUMENTS

| KR | 2012-0046393 A | 5/2012 |
| KR | 2015-0084268 A | 7/2015 |
| KR | 2007-0121951 A | 12/2017 |

\* cited by examiner (a) w/o compensation (b) w/ compensation

QUADRATURE RELAXATION OSCILLATOR USING FREQUENCY ERROR COMPENSATION LOOP

TECHNICAL FIELD

The present disclosure relates to a technology for compensating for a frequency error of a quadrature relaxation oscillator, and more particularly, to a quadrature relaxation oscillator using a frequency error compensation loop, which can generate a signal at a desired frequency by using a resistor and a capacitor which are less sensitive to a PVT (Process, Voltage, Temperature) variation, generate a signal at a desired frequency by compensating for an error from design, which occurs depending on a circuit mismatch due to a characteristic of a semiconductor process, through a feedback loop, and remove noise.

BACKGROUND ART

In general, an oscillator is widely used in various power supply devices or driving devices, and roughly classified into a tuned oscillator and a relaxation oscillator referred to as a charge/discharge oscillator, depending on an implementation method.

The relaxation oscillator, as an oscillator that generates a signal of a desired frequency by using electrical characteristics of a resistor and a capacitor, includes a resistor, a capacitor and a comparator.

Basically, the relaxation oscillator repeats an operation of comparing a charge voltage of the capacitor and a reference voltage by the comparator while charging the capacitor, and discharging and recharging the capacitor when an output logic is changed according to a comparison result.

At this time, an undesired delay occurs in the comparator, and thereby, a frequency error occurs. Recently, circuits which use a feedback loop to compensate for such a delay of the comparator have been suggested. An amplifier is used in such a feedback loop, and a chopping technique is employed to remove low-frequency noise of the amplifier.

In the relaxation amplifier according to the related art, however, a frequency error may be caused by an offset voltage of the comparator and the amplifier, which are generated by a mismatch in process, and a delay which occurs in the comparator.

Furthermore, in the relaxation amplifier according to the related art, the amplifier used for the comparator and the feedback loop may generate low-frequency noise which is responsible for a frequency error and disturbs a stable oscillating operation.

DISCLOSURE

Technical Problem

An object of the present invention is to provide a technique for preventing an offset voltage of a comparator and an amplifier, which is caused by a mismatch in process in a quadrature relaxation oscillator, and a frequency different from a target frequency, which is caused by a delay in the comparator.

Another object of the present invention is to provide a technique for removing low-frequency noise generated by a comparator and an amplifier used for a feedback loop.

Technical Solution

In accordance with an embodiment, a quadrature relaxation oscillator using a frequency error compensation loop may include: a charge control unit configured to provide a charge path or a discharge path for generating an I clock signal and a Q clock signal at a corresponding phase among first to fourth phases; a charge unit configured to charge a power supply voltage supplied through the charge path or discharge a previously-charged voltage through the discharge path, and output corresponding first and second charge/discharge voltages; a reference voltage generation unit configured to output first and second upper reference voltages and first and second lower reference voltages by applying a frequency compensation method, wherein the reference voltage generation unit compares the first and second charge/discharge voltages with upper and lower reference voltages, respectively, at phases at which the levels of the first and second charge/discharge voltages are stopped, and outputs the first and second upper reference voltages and the first and second lower reference voltages which are synchronized with the first and second charge/discharge voltages; a comparison unit configured to compare the first charge/discharge voltage with the first upper and lower reference voltages and compare the second charge/discharge voltage with the second upper and lower reference voltages, and output corresponding respective logic signals; and an S-R latch unit configured to latch the respective logic signals and output the I clock signal and the Q clock signal corresponding thereto.

Advantageous Effects

In accordance with the present invention, the quadrature relaxation oscillator can effectively prevent an offset voltage of a comparator and an amplifier, which is caused by a mismatch in process in the quadrature relaxation oscillator, and a frequency different from a target frequency, which is caused by a delay in the comparator.

Furthermore, the quadrature relaxation oscillator can remove low-frequency noise generated by the comparator and the amplifier used for a feedback loop, thereby contributing to a stable oscillation operation.

Furthermore, the quadrature relaxation oscillator can generate frequencies having a quadrature phase quadrature phase relationship with each other, and thus double efficiency in terms of energy.

Furthermore, the frequency compensation method applied to the present invention can remove a frequency error caused by a mismatch in process which occurs outside a resistor and a capacitor, and efficiently remove low-frequency noise and chopping noise which are generated in a circuit.

BRIEF DESCRIPTION OF DRAWINGS

FIG. 6 is a graph illustrating a frequency error when an offset voltage occurs and a frequency error when the offset voltage is compensated for.

MODE FOR INVENTION

Hereafter, exemplary embodiments of the present invention will be described in detail with reference to the accompanying drawings.

Figure 1:
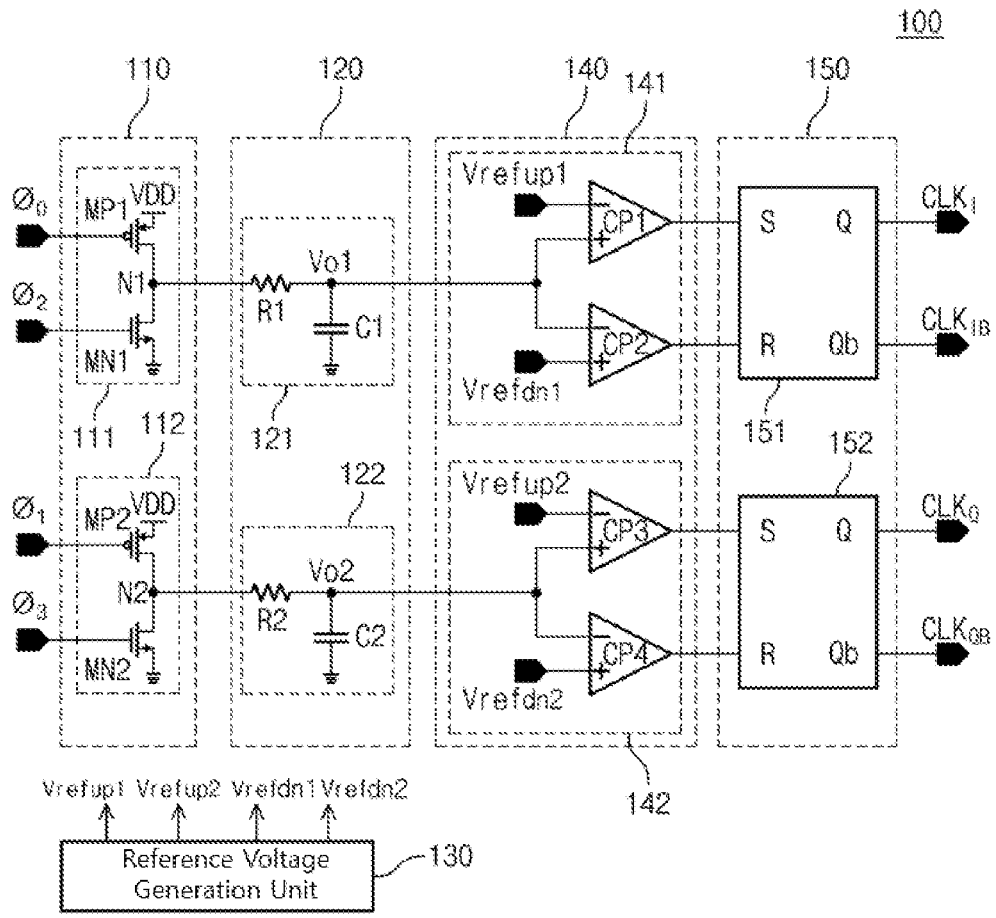
FIG. 1 is a block diagram of a quadrature relaxation oscillator using a frequency error compensation loop in accordance with an embodiment of the present invention.

FIG. 1 is a block diagram illustrating a quadrature relaxation oscillator using a frequency error compensation loop in accordance with an embodiment of the present invention. As illustrated in FIG. 1, the relaxation oscillator 100 includes a charge control unit 110, a charge unit 120, a reference voltage generation unit 130, a comparison unit 140 and an S-R latch unit 150.

The charge control unit 110 provides a charge path or a discharge path for generating I clock signals $CLK_I$ and $CLKI_B$ and Q clock signals $CLK_Q$ and $CLK_{QB}$ at a corresponding phase among first to fourth phases $\Phi_0$ to $\Phi_3$. For this operation, the charge control unit 110 includes a first charge control unit 111 and a second charge control unit 112.

The first charge control unit 111 includes a PMOS transistor MP1 and an NMOS transistor MN1. The PMOS transistor MP1 provides a charge path to supply a power supply voltage VDD as a charge voltage at the first phase $\Phi_0$, and the NMOS transistor MN1 provides a discharge path to discharge a previously-charged voltage at the third phase $\Phi_2$.

The second charge control unit 112 includes a PMOS transistor MP2 and an NMOS transistor MN2. The PMOS transistor MP2 provides a charge path to supply the power supply voltage VDD as a charge voltage at the second phase $\Phi_1$, and the NMOS transistor MN2 provides a discharge path to discharge a previously-charged voltage at the fourth phase $\Phi_3$.

The charge unit 120 outputs first and second charge/discharge voltages Vo1 and Vo2 while charging the power supply voltage VDD supplied through the charge path of the charge control unit 110 or discharging the previously-charged voltage through the discharge path of the charge control unit 110. For this operation, the charge unit 120 includes a first charge unit 121 and a second charge unit 122.

The first charge unit 121 includes a resistor R1 and a capacitor C1 which are coupled in series between a first charge/discharge node N1 of the first charge control unit 111 and a ground terminal, and outputs the first charge/discharge voltage Vo1.

The second charge unit 122 includes a resistor R2 and a capacitor C2 which are coupled in series between a second charge/discharge node N2 of the second charge control unit 112 and the ground terminal, and outputs the second charge/discharge voltage Vo2.

The reference voltage generation unit 130 generates and outputs first and second upper reference voltages Vrefup1 and Vrefup2 and first and second lower reference voltages Vrefdn1 and Vrefdn2. However, a frequency error may occur in the relaxation oscillator 100 due to a delay or offset voltage in first to fourth comparators CP1 to CP4. In order to prevent such a frequency error, the reference voltage generation unit 130 includes a frequency error compensation loop that compares the first and second charge/discharge voltages Vo1 and Vo2 with upper and lower reference voltages Vup and Vdn, respectively, at a phase where the levels of the first and second charge/discharge voltages Vo1 and Vo2 are stopped, and outputs the first and second upper reference voltages Vrefup1 and Vrefup2 and the first and second lower reference voltages Vrefdn1 and Vrefdn2 which are synchronized with the first and second charge/discharge voltages Vo1 and Vo2.

The comparison unit 140 compares the first charge/discharge voltage Vo1 with the first upper and lower reference voltages Vrefup1 and Vrefdn1, compares the second charge/discharge voltage Vo2 with the second upper and lower reference voltages Vrefup2 and Vrefdn2, and outputs logic signals according to the respective comparison results. For this operation, the comparison unit 140 includes a first comparison unit 141 and a second comparison unit 142.

The first comparison unit 141 includes the first and second comparators CP1 and CP2 that compare the first charge/discharge voltage Vo1 with the first upper and lower reference voltages Vrefup1 and Vrefdn1, and output logic signals according to the respective comparison results.

The second comparison unit 142 includes the third and fourth comparators CP3 and CP4 that compare the second charge/discharge voltage Vo2 with the second upper and lower reference voltages Vrefup2 and Vrefdn2, and output logic signals according to the respective comparison results.

The S-R latch unit 150 latches the logic signals supplied from the comparison unit 140, and outputs the latched signals as the I clock signals $CLK_I$ and $CLK_{IB}$ and the Q clock signals $CLK_Q$ and $CLK_{QB}$. The I clock signals $CLK_I$ and $CLK_{IB}$ are exactly out of phase with each other, and the Q clock signals $CLK_Q$ and $CLK_{QB}$ are also exactly out of phase with each other. For this configuration, the S-R latch unit 150 includes a first S-R latch 151 and a second S-R latch 152.

The first S-R latch 151 receives the logic signal outputted from the first comparator CP1 of the first comparison unit 141 through a set terminal S thereof, receives the logic signal outputted from the second comparator CP2 through a reset terminal R thereof, and outputs the I clock signals $CLK_I$ and $CLK_{IB}$.

The second S-R latch 152 receives the logic signal outputted from the third comparator CP3 of the second comparison unit 142 through a set terminal S thereof, receives the logic signal outputted from the fourth comparator CP4 through a reset terminal R thereof, and outputs the Q clock signals $CLK_Q$ and $CLK_{QB}$.

Figure 2:
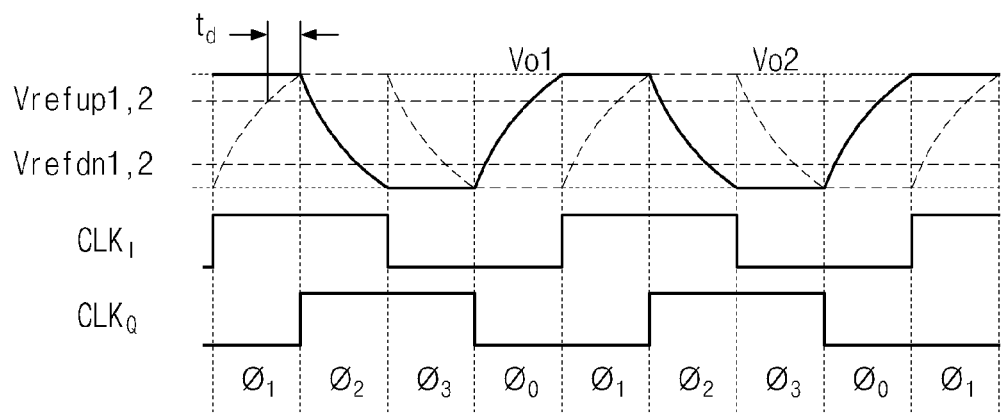
FIG. 2 is a waveform diagram illustrating reference voltages and clock signals in FIG. 1.

FIG. 2 is a waveform diagram of the first charge/discharge voltage Vo1 outputted from the first charge unit 121, the second charge/discharge voltage Vo2 outputted from the second charge unit 122, the I clock signal $CLK_I$ outputted from the first S-R latch 151 of the S-R latch unit 150, and the Q clock signal $CLK_Q$ outputted from the second S-R latch 152.

Referring to the waveform diagram of FIG. 2, the operation of the relaxation oscillator 100 will be described below.

First, as a 'low' voltage is supplied to the gate of the PMOS transistor MP1 of the first charge control unit 111 at the first phase $\Phi_0$, the PMOS transistor MP1 is turned on and the other transistors MN1, MP2 and MN2 are maintained in an off state. Therefore, the capacitor C1 starts to be charged with the power supply voltage VDD through the PMOS transistor MP1, the first charge/discharge node N1 and the resistor R1. Thus, the first charge/discharge voltage Vo1 of the capacitor C1 of the first charge unit 121 starts to rise as illustrated in FIG. 2. Then, when the first charge/discharge voltage Vo1 continuously rises and exceeds the first upper reference voltage Vrefup1, the first comparator CP1 of the first comparison unit 141 starts to output a 'high' voltage. Therefore, since the 'high' voltage is supplied to the set terminal S of the first S-R latch 151, the logic of the I clock signal $CLK_I$ outputted from an output terminal Q of the first S-R latch 151 transitions from 'low' to 'high'.

At the second phase $\Phi_1$, as a 'low' voltage is supplied to the gate of the PMOS transistor MP2 of the second charge control unit 112, the PMOS transistor MP2 is turned on and the other transistors MP1, MN1 and MN2 are maintained in an off state. Therefore, the capacitor C2 starts to be charged with the power supply voltage VDD through the PMOS transistor MP2, the second charge/discharge node N2 and the resistor R2. Thus, the second charge/discharge voltage Vo2 of the capacitor C2 of the second charge unit 122 starts to rise as illustrated in FIG. 2. Then, when the second charge/discharge voltage Vo2 continuously rises and exceeds the second upper reference voltage Vrefup2, the third comparator CP3 of the second comparison unit 142 starts to output a 'high' voltage. Therefore, since the 'high' voltage is supplied to the set terminal S of the second S-R latch 152, the logic of the Q clock signal $CLK_Q$ outputted from an output terminal Q of the second S-R latch 152 transitions from 'low' to 'high'.

At the third phase $\Phi_2$, as a 'high' voltage is supplied to the gate of the NMOS transistor MN1 of the first charge control unit 111, the NMOS transistor MN1 is turned on and the other transistors MP1, MP2 and MN2 are maintained in an off state. Thus, the charge voltage of the capacitor C1 starts to be discharged to the ground terminal through the resistor R1, the first charge/discharge node N1 and the NMOS transistor MN1. Thus, the first charge/discharge voltage Vo1 of the capacitor C1 of the first charge unit 121 starts to fall as illustrated in FIG. 2. Then, when the first charge/discharge voltage Vo1 continuously falls and becomes lower than the first lower reference voltage Vrefdn1, the second comparator CP2 of the first comparison unit 141 starts to output a 'high' voltage. Therefore, since the 'high' voltage is supplied to the reset terminal R of the first S-R latch 151, the logic of the I clock signal $CLK_I$ outputted from the output terminal Q of the first S-R latch 151 transitions from 'high' to 'low'.

At the fourth phase $\Phi_3$, as a 'high' voltage is supplied to the gate of the NMOS transistor MN2 of the second charge control unit 112, the NMOS transistor MN2 is turned on and the other transistors MP1, MN1 and MP2 are maintained in an off state. Thus, the charge voltage of the capacitor C2 starts to be discharged to the ground terminal through the resistor R2, the second charge/discharge node N2 and the NMOS transistor MN2. Thus, the second charge/discharge voltage Vo2 of the capacitor C2 of the second charge unit 122 starts to fall as illustrated in FIG. 2. Then, when the second charge/discharge voltage Vo2 continuously falls and becomes lower than the second lower reference voltage Vrefdn2, the fourth comparator CP4 of the second comparison unit 142 starts to output a 'high' voltage. Therefore, since the 'high' voltage is supplied to the reset terminal R of the second S-R latch 152, the logic of the Q clock signal $CLK_Q$ outputted from the output terminal Q of the second S-R latch 152 transitions from 'high' to 'low'.

Even after that, the relaxation oscillator 100 periodically repeats the above-described operations at the respective phases $\Phi_0$ to $\Phi_3$, and thus generates the I clock signal $CLK_I$ and the Q clock signal $CLK_Q$ which have a quadrature phase relationship with each other.

However, an undesired delay occurring in the first to fourth comparators CP1 to CP4 and an offset voltage generated by a mismatch in process cause a frequency error. That is, when a delay occurs in the first to fourth comparators CP1 to CP4, the first charge/discharge voltage Vo1 may bounce slightly more than a difference between the first upper and lower reference voltages Vrefup1 and Vrefdn1 and the second charge/discharge voltage Vo2 may bounce slightly more than a difference between the second upper and lower reference voltages Vrefup2 and Vrefdn2. In this state, when the relaxation oscillator 100 oscillates, a frequency error may occur. Furthermore, the first and second charge/discharge voltages Vo1 and Vo2 may bounce with a difference corresponding to an offset voltage of the first to fourth comparators CP1 to CP4. In this case, a frequency error may occur.

Therefore, in the embodiment of the present invention, the reference voltage generation unit 130 compensates for a frequency error and outputs the first and second upper reference voltages Vrefup1 and Vrefup2 and the first and second lower reference voltages Vrefdn1 and Vrefdn2, in order to remove the frequency error caused by the first to fourth comparators CP1 to CP4.

Figure 3:
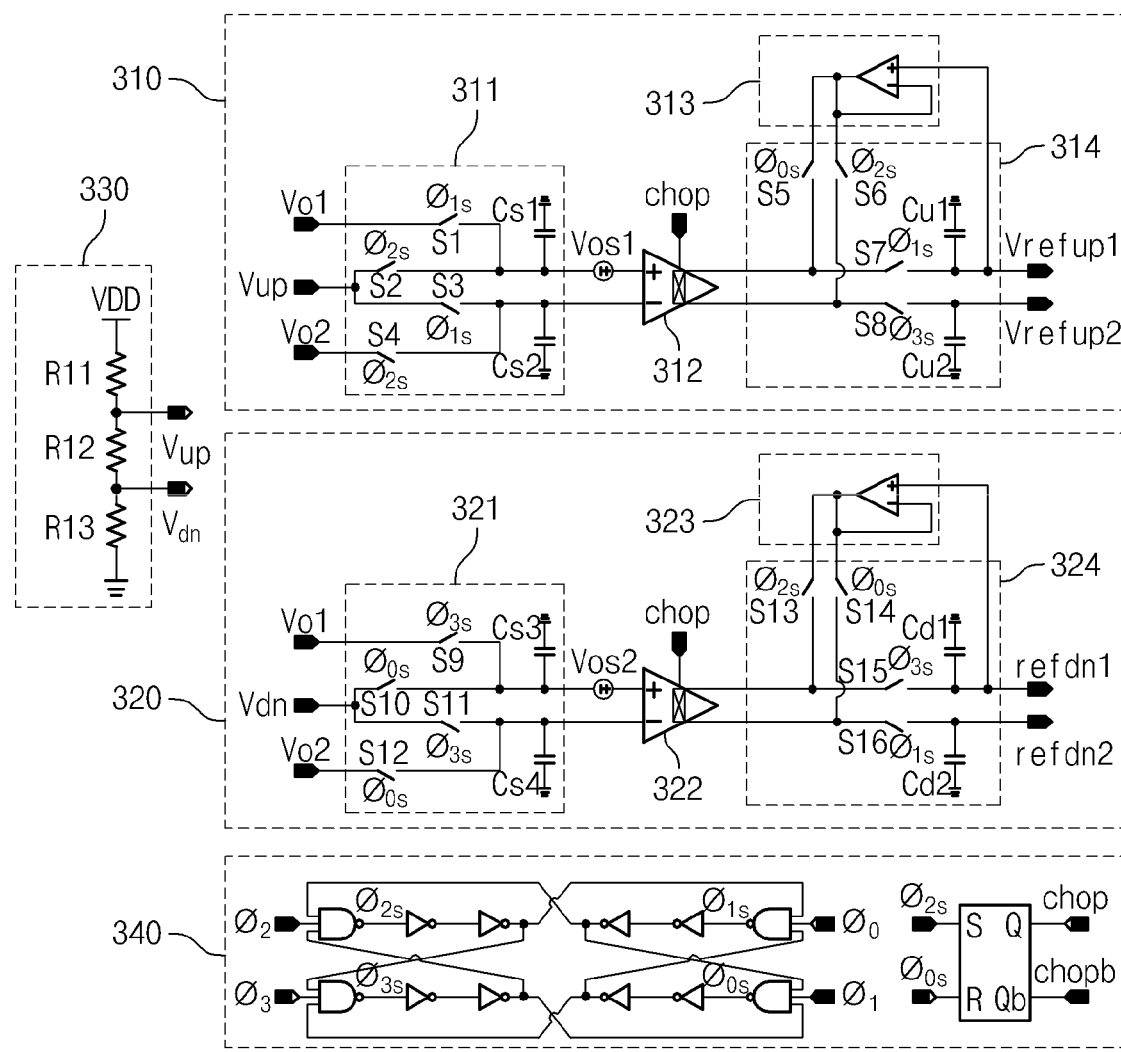
FIG. 3 is a detailed circuit diagram of a reference voltage generation unit.

FIG. 3 is a circuit diagram of the reference voltage generation unit 130 having a compensation function for a frequency error. As illustrated in FIG. 3, the reference voltage generation unit 130 includes a first frequency error compensation loop 310, a second frequency error compensation loop 320, a reference voltage generation circuit 330 and a switching control signal generation unit 340.

The first frequency error compensation loop 310 includes a first sampling unit 311, a first amplifier 312, a first sub amplifier 313 and a first error compensation unit 314. The first sampling unit 311 selects and samples the first charge/discharge voltage Vo1 and the upper reference voltage Vup at the second phase $\Phi_1$, and selects and samples the second charge/discharge voltage Vo2 and the upper reference voltage Vup at the third phase $\Phi_2$. The first amplifier 312 is a trans-conductance amplifier that converts and amplifies the voltage sampled by the first sampling unit 311 into an output current. The first sub amplifier 313 adjusts an output voltage of the first amplifier 312 to a similar level to the first upper reference voltage Vrefup1. The first error compensation unit 314 updates the first and second upper reference voltages Vrefup1 and Vrefup2 with the output current of the first amplifier 312, after the output voltage of the first amplifier 312 is adjusted to a similar level to the first upper reference voltage Vrefup1.

The second frequency error compensation loop 320 includes a second sampling unit 321, a second amplifier 322, a second sub amplifier 323 and a second error compensation unit 324. The second sampling unit 321 selects and samples the first charge/discharge voltage Vo1 and the lower reference voltage Vdn at the fourth phase $\Phi_3$, and selects and samples the second charge/discharge voltage Vo2 and the lower reference voltage Vdn at the first phase $\Phi_0$. The second amplifier 322 converts and amplifies the voltage sampled by the second sampling unit 321 into a current output. The second sub amplifier 323 adjusts an output voltage of the second amplifier 322 to a similar level to the first lower reference voltage Vrefdn1. The second error compensation unit 324 updates the first and second lower reference voltages Vrefdn1 and Vrefdn2 with the output current of the second amplifier 322, after the output voltage of the second amplifier 322 is adjusted to a similar level to the first and second lower reference voltages Vrefdn1 and Vrefdn2.

The reference voltage generation circuit 330 outputs the upper reference voltage Vup and the lower reference voltage Vdn. For this operation, the reference voltage generation circuit 330 includes resistors R11 to R13 coupled in series between a power supply voltage VDD and a ground voltage GND, outputs the upper reference voltage Vup at a connection point between the resistors R11 and R12, and outputs the lower reference voltage Vdn at a connection point between the resistors R12 and R13.

The switching control signal generation unit 340 outputs switching control signals $\Phi_{0S}$ to $\Phi_{3S}$ for controlling switching operations of switches included in the first and second frequency error compensation loops 310 and 320.

The process in which the first frequency error compensation loop 310 compensates for a frequency error and outputs the first and second upper reference voltages Vrefup1 and Vrefup2 synchronized with the first and second charge/discharge voltages Vo1 and Vo2 will be described below based on the first to fourth phases $\Phi_0$ to $\Phi_3$. The following descriptions will be based on an example in which the first switching control signal $\Phi_{0S}$ is outputted at the first phase $\Phi_0$, the second switching control signal $\Phi_{1S}$ is outputted at the second phase $\Phi_1$, the third switching control signal $\Phi_{2S}$ is outputted at the third phase $\Phi_2$, and the fourth switching control signal $\Phi_{3S}$ is outputted at the fourth phase $\Phi_3$.

First, at the first phase $\Phi_0$, as a switch S5 is turned on by the first switching control signal $\Phi_{0S}$, an output terminal of the first sub amplifier 313 is coupled to an output terminal of the first amplifier 312 through the switch S5. Therefore, an output voltage of the first amplifier 312 and an output voltage of the first sub amplifier 313 have a similar level to the level of the first upper reference voltage Vrefup1.

Since the output terminal of the first amplifier 312 has high impedance, the output terminal of the first amplifier 312 has a voltage value close to the power supply voltage VDD or the ground voltage GND in most situations. Furthermore, an undesired parasitic capacitor component is present in the output terminal of the first amplifier 312. Thus, when a switch S7 is turned on by the second switching control signal $\Phi_{1S}$ at the next second phase $\Phi_1$, the first upper reference voltage Vrefup1 is significantly changed by charge sharing.

In order to minimize such a change, the switch S7 is turned on at the first phase $\Phi_0$ such that the output voltage of the first amplifier 312 and the output voltage of the first sub amplifier 313 have a similar level to the level of the first upper reference voltage Vrefup1, before the output terminal of the first amplifier 312 is coupled to the first upper reference voltage Vrefup1.

At the second phase $\Phi_1$, switches S1, S3 and S7 are turned on by the second switching control signal $\Phi_{1S}$. Thus, the first charge/discharge voltage Vo1 is supplied to a capacitor Cs1 through the switch S1 and sampled in the capacitor Cs1, and the upper reference voltage Vup is supplied to a capacitor Cs2 through the switch S3 and sampled in the capacitor Cs2.

Therefore, the first amplifier 312 outputs a current proportional to a difference between the first charge/discharge voltage Vo1 sampled in the capacitor Cs1 and the upper reference voltage Vup sampled in the capacitor Cs2, in order to update the first upper reference voltage Vrefup1.

At the third phase $\Phi_2$, switches S2, S4 and S6 are turned on by the third switching control signal $\Phi_{2S}$. Thus, the upper reference voltage Vup is supplied to the capacitor Cs1 through the switch S2 and sampled in the capacitor Cs1, and the second charge/discharge voltage Vo2 is supplied to the capacitor Cs2 through the switch S4 and sampled in the capacitor Cs2. Furthermore, the output terminal of the first sub amplifier 313 is coupled to the output terminal of the first amplifier 312 through the switch S6. Therefore, the output voltage of the first amplifier 312 and the output voltage of the first sub amplifier 313 have a similar level to the level of the first upper reference voltage Vrefup1.

Finally, at the fourth phase $\Phi_3$, a switch S8 is turned on by the fourth switching control signal $\Phi_{3S}$. The first amplifier 312 outputs a current proportional to a difference between the upper reference voltage Vup sampled in the capacitor Cs1 and the second charge/discharge voltage Vo2 sampled in the capacitor Cs2 through the switch S8, in order to update the second upper reference voltage Vrefup2.

The second frequency error compensation loop 320 updates the first and second lower reference voltages Vrefdn1 and Vrefdn2 through the same process as the first frequency error compensation loop 310.

In the end, the reference voltage generation unit 130 adjusts the voltage levels of the output terminals of the first amplifier 312 and the first sub amplifier 313 to similar levels to the voltages of the capacitors Cs1 and Cs2 through the above-described process, before the first and second lower reference voltages Vrefdn1 and Vrefdn2 are updated through the second amplifier 322 and the second sub amplifier 323, which makes it possible to minimize an influence by charge sharing. Furthermore, since a valid gain of the first amplifier 312 is considerably increased through the above-described process, the current used in the first amplifier 312 can be significantly reduced.

Figure 4A:
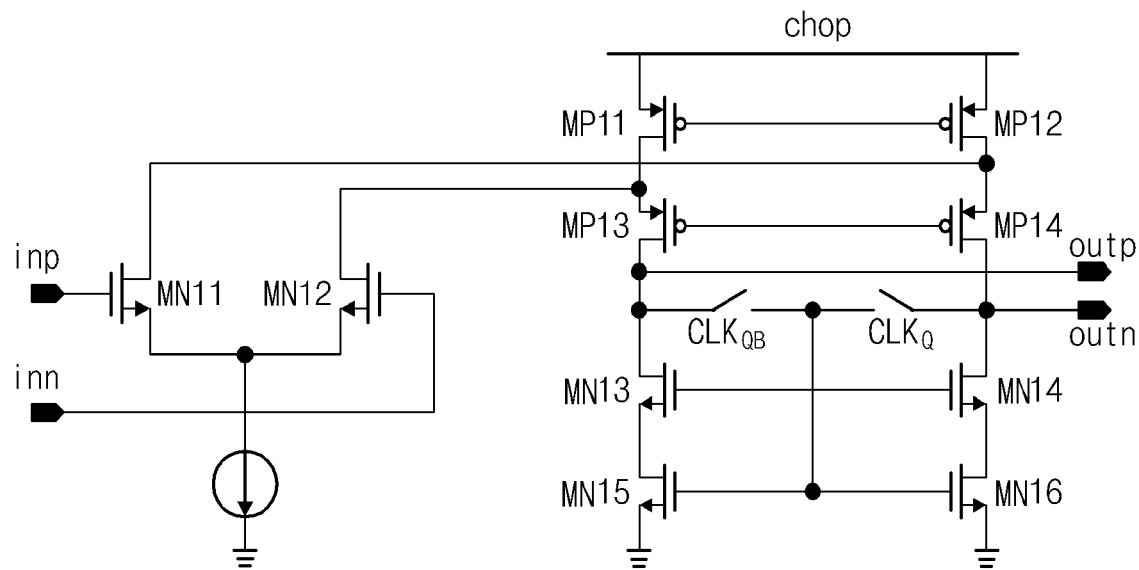
FIG. 4A is a detailed circuit diagram of a first amplifier.
Figure 4B:
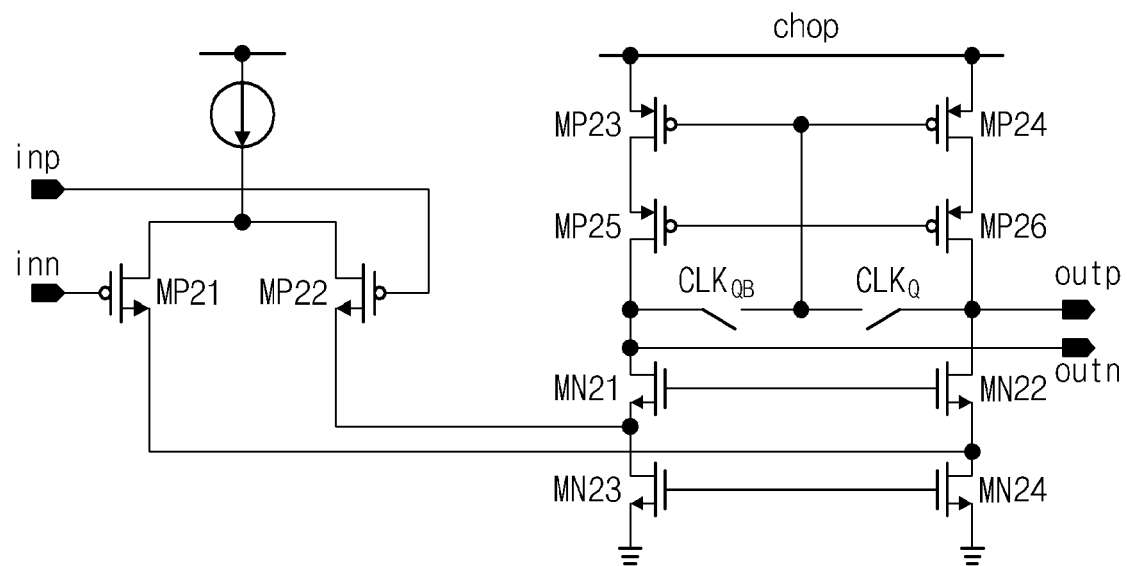
FIG. 4B is a detailed circuit diagram of a second amplifier.

FIG. 4A is a detailed circuit diagram of the first amplifier 312 included in the first frequency error compensation loop 310, and FIG. 4B is a detailed circuit diagram of the second amplifier 322 included in the second frequency error compensation loop 320. The first and second amplifiers 312 and 322 have a configuration modified from a basic folded cascode amplifier in order to apply a chopping scheme.

As illustrated in FIG. 4A, the first amplifier 312 for updating the first and second upper reference voltages Vrefup1 and Vrefup2 through output terminals outp and outn includes NMOS transistors MN11 and MN12 to input a high voltage such as the upper reference voltage Vup.

As illustrated in FIG. 4B, the second amplifier 322 for updating the first and second lower reference voltages Vrefdn1 and Vrefdn2 through output terminals outp and outn includes PMOS transistors MP21 and MP22 to input a low voltage such as the lower reference voltage Vdn.

Since outputs of the first and second amplifiers 312 and 322 are single ended outputs, the first and second amplifiers 312 and 322 are designed in such a manner that the direction of an active load is changed to provide a chopping function.

Figure 5:
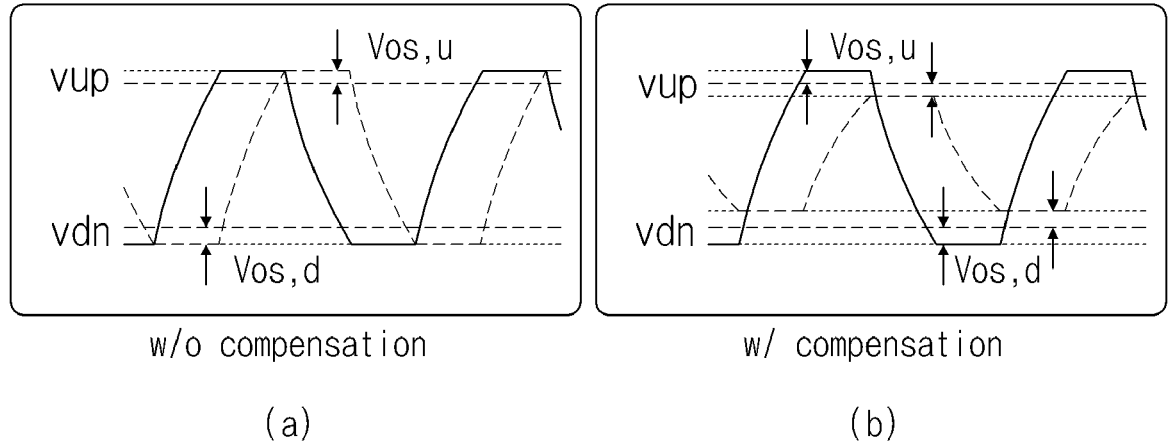
FIG. 5 is a waveform diagram illustrating that an offset voltage occurs and a waveform diagram illustrating that the offset voltage is compensated for by a frequency compensation method.

(a) of the FIG. 5 illustrates that an offset voltage is generated by a mismatch in process of the first and second amplifiers 312 and 322 used in the first and second frequency error compensation loops 310 and 320 of the quadrature relaxation oscillator 100 in accordance with the embodiment of the present invention, and (b) of the FIG. 5 illustrates that the offset voltage is compensated for by a frequency compensation method in accordance with an embodiment of the present invention. The frequency compensation method for minimizing a frequency error in accordance with the embodiment of the present invention will be described below.

In FIG. 3, a difference between input voltages of the first amplifier 312 needs to be ideally zero. However, since the input voltage difference rises or falls by an offset voltage Vos1 generated by a mismatch, the input voltage difference becomes (Vo1, $\Phi_1$+Vos1−Vup) at the phase a), and becomes (Vup+Vos1−Vo2, $\Phi_2$) at the phase $\Phi_2$. When the offset voltage Vos1 occurs in the first amplifier 312 while the first frequency error compensation loop 310 stably generates the first and second upper reference voltages Vrefup1 and Vrefup2, the first frequency error compensation loop 310 generates the first and second upper reference voltages Vrefup1 and Vrefup2 to have a difference corresponding to the offset voltage Vos1.

At this time, the first and second charge/discharge voltages Vo1 and Vo2 become (Vo1, $\Phi_1$=Vup−Vos1) and (Vo2, $\Phi_2$=Vup+Vos1), respectively. That is, as illustrated in the waveform diagram of (b) of the FIG. 5, the first and second charge/discharge voltages Vo1 and Vo2 oscillate at a low amplitude Vos,d or high amplitude Vos.u lower by the offset voltage than the upper reference voltage Vup, thereby stabilizing the loop.

Figure 6:
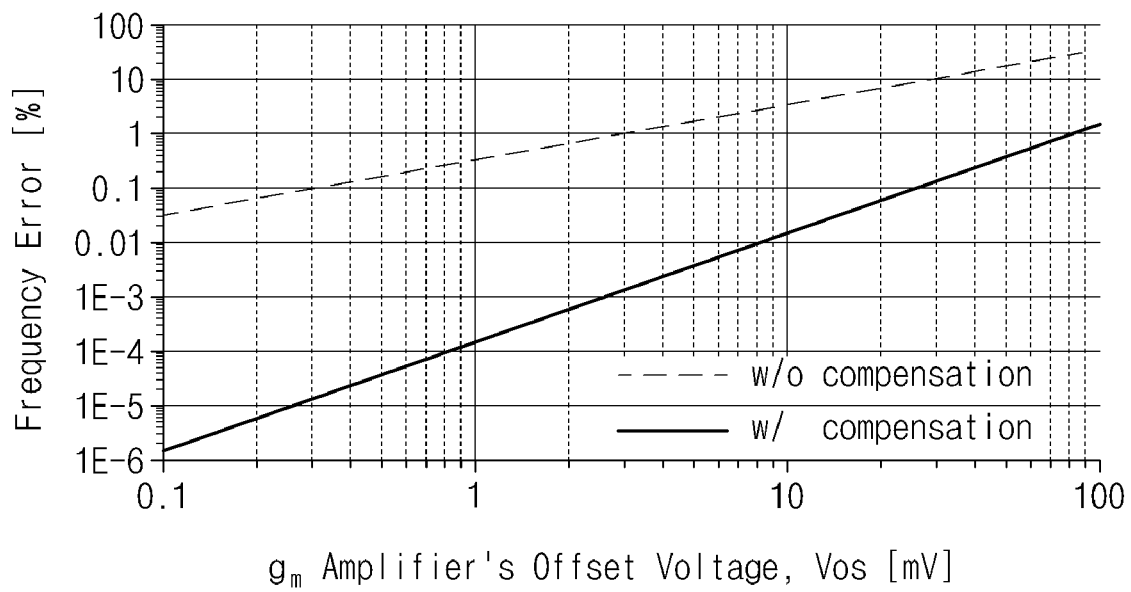

When the amplitudes of the first and second charge/discharge voltages Vo1 and Vo2 increase together as the first and second charge/discharge voltages Vo1 and Vo2 have an offset voltage in the same direction, the frequency error increases as illustrated in a dotted graph of FIG. 6. However, when the above-described frequency compensation method is used, the frequency error reduction effect is improved about 20 times in the case that an offset voltage of 10 mV occurs in the first and second amplifiers 312 and 322. Furthermore, as the offset voltage decreases, the frequency error further decreases.

The reason why the frequency compensation method can remove the influence by the offset voltages Vos1 and Vos2 of the first and second amplifiers 312 and 322 is that, when the offset voltages Vos1 and Vos2 of the first and second amplifiers 312 and 322 occur, delay times of the first and second charge/discharge voltages Vo1 and Vo2 are increased once and decreased once by delay amounts corresponding to the offset voltages Vos1 and Vos2.

For example, when the offset voltage Vos1 occurs in the first amplifier 312 for generating the first and second upper reference voltages Vrefup1 and Vrefup2, the time of the first phase $\Phi_0$ is increased, but the time of the second phase $\Phi_1$ is decreased. Furthermore, when the offset voltage Vos2 occurs in the second amplifier 322 for generating the first and second lower reference voltages Vrefdn1 and Vrefdn2, the time of the third phase $\Phi_2$ is increased, but the time of the fourth phase $\Phi_3$ is decreased.

More specifically, when the compensation for the offset voltage Vos1 of the first amplifier 312 is performed, any one of the first and second charge/discharge voltages Vo1 and Vo2 oscillates at a voltage higher by the offset voltage Vos1 than the upper reference voltage Vup, and the other one oscillates at a voltage lower by the offset voltage Vos1 than the upper reference voltage Vup. At this time, since it takes a longer time as the one charge/discharge voltage oscillates at a voltage higher by the offset voltage Vos1, the time of the corresponding phase is increased. Furthermore, when the other charge/discharge voltage oscillates at a voltage lower by the offset voltage Vos1, the other charge/discharge voltage may rise less by the offset voltage Vos1. Thus, the time of the corresponding phase is decreased. At this time, since the offset voltages when the charge/discharge voltages oscillate at high and low voltages are offset voltages generated by the same first amplifier 312, the offset voltages have similar values. Thus, while the amounts of time which are increased and decreased at the respective phases become similar to each other, the offset voltages are effectively offset.

For this reason, when the time of any one of the phases $\Phi_0$ and $\Phi_1$ at which the first and second charge/discharge voltages Vo1 and Vo2 rise is increased, the time of the other phase is decreased. Similarly, when the time of any one of the phases $\Phi_2$ and $\Phi_3$ at which the first and second charge/discharge voltages Vo1 and Vo2 fall is increased, the time of the other phase is decreased. At this time, the increase or decrease in the time is decided by the signs of the offset voltages Vos1 and Vos2 of the first and second amplifiers 312 and 322.

Such a frequency compensation method serves to reduce low-frequency noise of the first and second amplifiers 312 and 322 as well as the offset voltages of the first and second amplifiers 312 and 322. When the offset voltages Vos1 and Vos2 of the first and second amplifiers 312 and 322 are changed to low-frequency voltages by low-frequency noise, a comparison voltage is updated through a feedback loop, which makes it possible to prevent a change in frequency of the first and second amplifiers 312 and 322 by the low-frequency noise.

In order to remove the low-frequency noise of the amplifier, the chopping scheme increases an output voltage once and decreases the output voltage once in the case that an offset voltage occurs in an amplifier, thereby removing an influence by the offset voltage. At this time, when a low frequency is generated, a capacitor having a considerably large capacity needs to be used to remove noise caused by chopping. However, the frequency compensation method applied to the present invention divides each of the outputs of the first and second amplifiers 312 and 322 into two parts, thereby preventing a phenomenon that the output bounces due to a chopping frequency. Therefore, noise by the chopping frequency does not occur.

Figure 7:
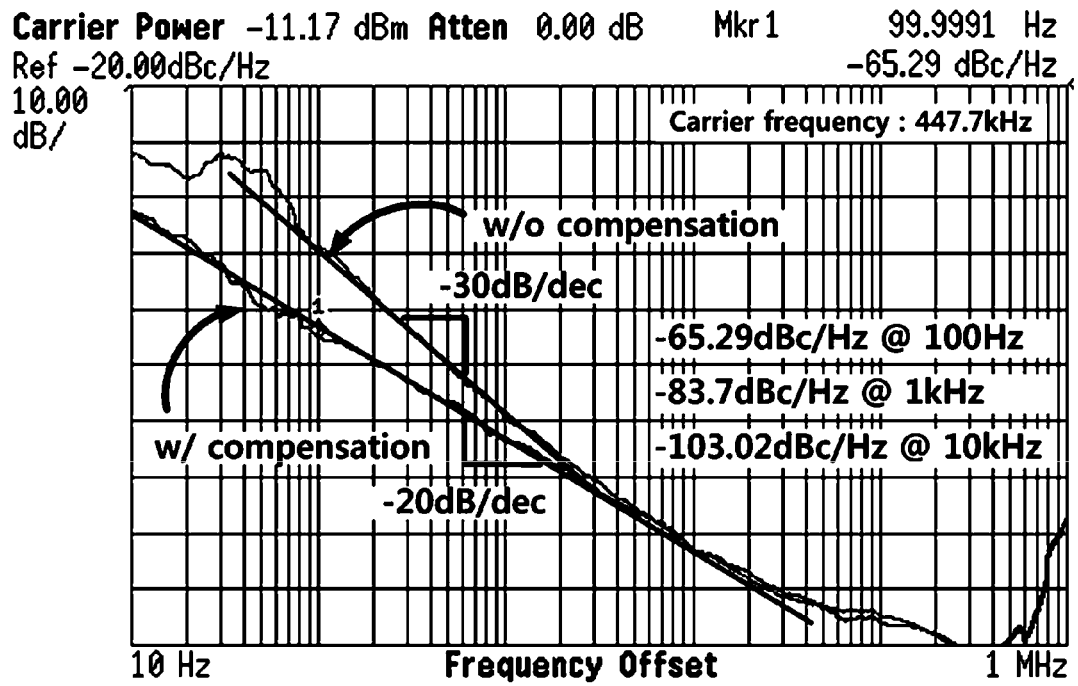
FIG. 7 illustrates experimental results obtained by measuring phase noise when frequency compensation is performed on the relaxation oscillator in accordance with the embodiment of the present invention and phase noise when the frequency compensation is not performed on the relaxation oscillator.

FIG. 7 illustrates experimental results obtained by measuring phase noise when frequency compensation for the relaxation oscillator 100 in accordance with the present invention is performed (W/compensation) and phase noise when frequency compensation is not performed (W/O compensation). The results show that the frequency compensation method can effectively remove low-frequency noise. When the frequency compensation method is not used, noise is generated by low-frequency noise as a gain decreases to −30 dB/dec before 3 kHz. After 3 kHz, the gain decreases to −20 dB/dec.

For example, when the offset compensation for the first amplifier 312 is performed, one of the first and second charge/discharge voltages Vo1 and Vo2 oscillates at a voltage higher by the offset voltage Vos1, and the other one oscillates as a voltage lower by the offset voltage Vos1. This graph is represented by W/compensation. Furthermore, when the offset compensation is not performed, both of the first and second charge/discharge voltages Vo1 and Vo2 oscillate at a voltage lower or higher by the offset voltage Vos1. This graph is represented by W/O compensation.

Figure 8:
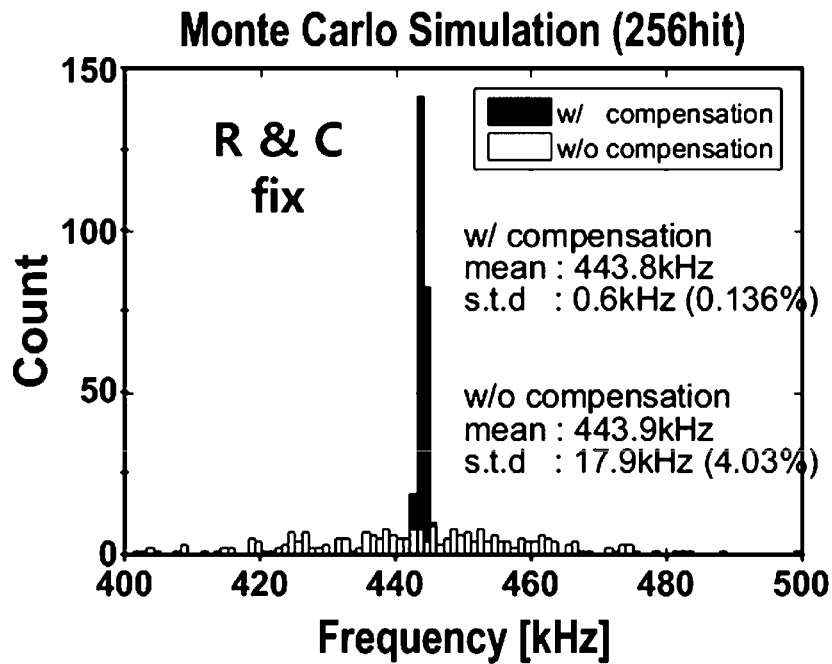
FIG. 8 is a simulation result graph illustrating an influence caused by a mismatch.

FIG. 8 is a graph illustrating a Monte-Carlo simulation result for describing an influence by mismatch of the transistors MP1 and MN1 and the transistors MP2 and MN2 in a state where the values of the resistors R1 and R2 and the capacitors C1 and C2 are fixed in FIG. 1. This graph shows that the frequency error by the mismatch of the amplifiers is significantly reduced from 4.03% to 0.136% by the effect of the frequency compensation loop.

Figure 9:
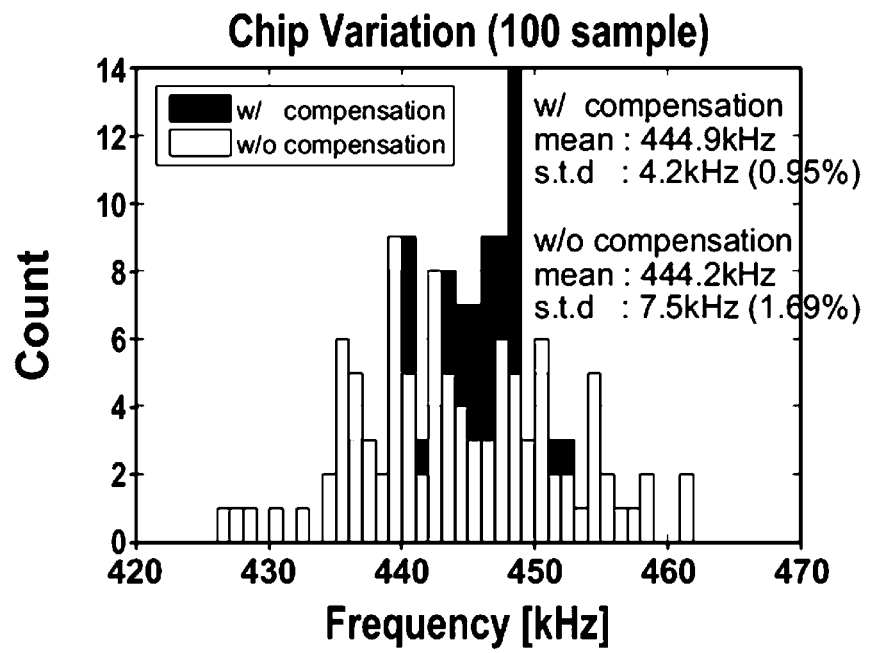
FIG. 9 is a distribution graph illustrating results obtained by measuring frequencies of 100 relaxation oscillators which are actually manufactured as chips.

FIG. 9 is a distribution graph illustrating results obtained by measuring frequencies of 100 relaxation oscillators 100 which are actually manufactured as chips. This graph shows that the frequency error is reduced from 1.69% to 0.95% when the frequency compensation method in accordance with the present invention is applied.

Figure 10:
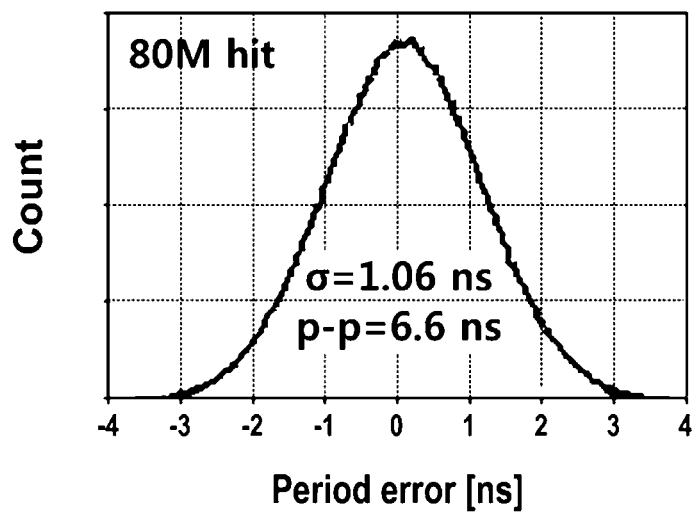
FIG. 10 is a graph illustrating periodic jitter of a clock signal generated by the relaxation oscillator in accordance with the embodiment of the present invention.

FIG. 10 is a graph illustrating periodic jitter of a clock signal generated by the relaxation oscillator 100 in accordance with the embodiment of the present invention.

Figure 11:
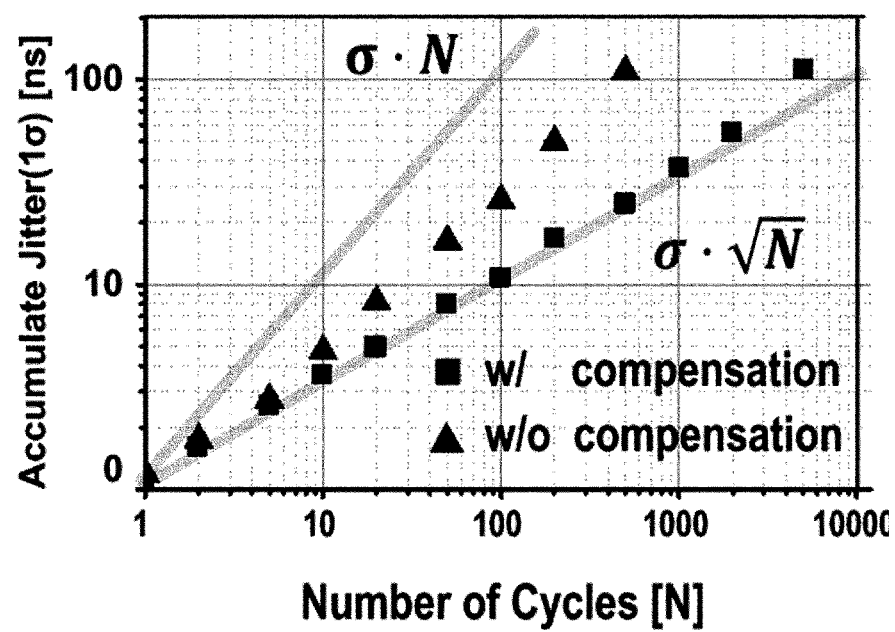
FIG. 11 is a graph illustrating accumulated jitter of the clock signal generated by the relaxation oscillator in accordance with the embodiment of the present invention, depending on accumulation cycles.

FIG. 11 is a graph illustrating accumulated jitter of the clock signal generator by the relaxation oscillator 100 in accordance with the embodiment of the present invention, depending on accumulation cycles. FIG. 11 shows that, as the number of accumulation cycles is increased by frequency compensation, the accumulated jitter significantly decreases.

While various embodiments have been described above, it will be understood to those skilled in the art that the embodiments described are by way of example only. Accordingly, the disclosure described herein should not be limited based on the described embodiments.

The invention claimed is:

1. A quadrature relaxation oscillator using a frequency error compensation loop, comprising:
   a charge control unit configured to provide a charge path or a discharge path for generating an I clock signal and a Q clock signal at a corresponding phase among first to fourth phases;
   a charge unit configured to charge a power supply voltage supplied through the charge path or discharge a previously-charged voltage through the discharge path, and output corresponding first and second charge/discharge voltages;
   a reference voltage generation unit configured to output first and second upper reference voltages and first and second lower reference voltages by applying a frequency compensation method, wherein the reference voltage generation unit compares the first and second charge/discharge voltages with upper and lower reference voltages, respectively, at phases at which levels of the first and second charge/discharge voltages are stopped, and outputs the first and second upper reference voltages and the first and second lower reference voltages which are synchronized with the first and second charge/discharge voltages;
   a comparison unit configured to compare the first charge/discharge voltage with the first upper and lower reference voltages and compare the second charge/discharge voltage with the second upper and lower reference voltages, and output corresponding respective logic signals; and
   an S-R latch unit configured to latch the respective logic signals and output the I clock signal and the Q clock signal corresponding thereto.

2. The quadrature relaxation oscillator of claim 1, wherein the charge control unit comprises:
   a first charge control unit including a first PMOS transistor which provides a charge path to supply the power supply voltage as a charge voltage at the first phase and a first NMOS transistor which provides a discharge path to discharge the previously-charged voltage at the third phase; and
   a second charge control unit including a second PMOS transistor which provides a charge path to supply the power supply voltage as a charge voltage at the second phase and a second NMOS transistor which provides a discharge path to discharge the previously-charged voltage at the fourth phase.

3. The quadrature relaxation oscillator of claim 1, wherein the charge unit comprises:
   a first charge unit including a first resistor and a first capacitor which are coupled in series between a first charge/discharge node of the charge control unit and a ground terminal, and configured to output the first charge/discharge voltage; and
   a second charge unit including a second resistor and a second capacitor which are coupled in series between a second charge/discharge node of the charge control unit and the ground terminal, and configured to output the second charge/discharge voltage.

4. The quadrature relaxation oscillator of claim 1, wherein the reference voltage generation unit comprises:
   a first frequency error compensation loop configured to compensate for a frequency error and output the first and second upper reference voltages synchronized with the first and second charge/discharge voltages;
   a second frequency error compensation loop configured to compensate for a frequency error and output the first and second lower reference voltages synchronized with the first and second charge/discharge voltages;
   a reference voltage generation circuit configured to output the upper reference voltage and the lower reference voltage by using resistors coupled in series between the power supply voltage and the ground terminal; and
   a switching control signal generation unit configured to output switching control signals for controlling switching operations of switches included in the first and second frequency error compensation loops.

5. The quadrature relaxation oscillator of claim 4, wherein the first frequency error compensation loop comprises:
   a first sampling unit configured to select and sample the first charge/discharge voltage and the upper reference voltage at the second phase, and select and sample the second charge/discharge voltage and the upper reference voltage at the third phase;
   a first amplifier configured to convert and amplify a voltage sampled by the first sampling unit into a current;
   a first sub amplifier configured to cause an output voltage of the first amplifier to have a level similar to the first upper reference voltage; and
   a first error compensation unit configured to update the first and second upper reference voltages with the output current of the first amplifier, after the output voltage of the first amplifier is caused to have a level similar to the first upper reference voltage.

6. The quadrature relaxation oscillator of claim 4, wherein the second frequency error compensation loop comprises:
   a second sampling unit configured to select and sample the first charge/discharge voltage and the lower reference voltage at the fourth phase, and select and sample the second charge/discharge voltage and the lower reference voltage at the first phase;
   a second amplifier configured to convert and amplify a voltage sampled by the second sampling unit into a current;
   a second sub amplifier configured to cause an output voltage of the second amplifier to have a level similar to the first lower reference voltage; and
   a second error compensation unit configured to update the first and second lower reference voltages with the output current of the second amplifier, after the output voltage of the second amplifier is caused to have a level similar to the first lower reference voltage.

7. The quadrature relaxation oscillator of claim 1, wherein the comparison unit comprises:
- a first comparison unit including first and second comparators which compare the first charge/discharge voltage with the first upper and lower reference voltages and output corresponding respective logic signals; and
- a second comparison unit including third and fourth comparators which compare the second charge/discharge voltage with the first and second lower reference voltages and output corresponding respective logic signals.

8. The quadrature relaxation oscillator of claim 7, wherein the S-R latch unit comprises:
- a first S-R latch configured to receive a logic signal outputted from the first comparator through a set terminal thereof, receive a logic signal outputted from the second comparator through a reset terminal thereof, and output the I clock signal; and
- a second S-R latch configured to receive a logic signal outputted from the third comparator through a set terminal thereof, receive a logic signal outputted from the fourth comparator through a reset terminal thereof, and output the Q clock signal.

* * * * *